(12) United States Patent
Chien

(10) Patent No.: US 12,098,802 B2
(45) Date of Patent: Sep. 24, 2024

(54) BRACKET ASSEMBLY AND ELECTRONIC DEVICE

(71) Applicant: CINCOZE CO., LTD., New Taipei (TW)

(72) Inventor: Hsin-Te Chien, New Taipei (TW)

(73) Assignee: CINCOZE CO., LTD., New Taipei (TW)

( * ) Notice: Subject to any disclaimer, the term of this patent is extended or adjusted under 35 U.S.C. 154(b) by 326 days.

(21) Appl. No.: 17/865,424

(22) Filed: Jul. 15, 2022

(65) Prior Publication Data
US 2023/0383898 A1    Nov. 30, 2023

(30) Foreign Application Priority Data
May 30, 2022    (TW) .................................. 111120012

(51) Int. Cl.
*H05K 5/02*  (2006.01)
*F16M 13/02*  (2006.01)

(52) U.S. Cl.
CPC ........... *F16M 13/02* (2013.01); *H05K 5/0204* (2013.01); *F16M 2200/028* (2013.01)

(58) Field of Classification Search
CPC ....................................................... H05K 5/02
See application file for complete search history.

(56) References Cited

U.S. PATENT DOCUMENTS

| | | | |
|---|---|---|---|
| 5,924,684 A * | 7/1999 | Cheng | B25H 1/14 269/220 |
| 2009/0140121 A1 * | 6/2009 | Fujikawa | G02F 1/133308 248/544 |

* cited by examiner

*Primary Examiner* — Jerry Wu

(57) ABSTRACT

A bracket assembly includes a first bracket and a first lock bracket. The first bracket forms a plurality of first guide slots and a plurality of first locking holes, the first guide slot extends along a mounting direction, and a position of the first locking hole in the mounting direction is gradient; the first lock bracket is connected to the first bracket, and includes a first device connecting piece and a first bracket connecting piece, the first device connecting piece forms at least one first device locking hole thereon, the first bracket connecting piece is bent with respect to the first device connecting piece and forms a plurality of first lock holes. In addition, the disclosure further provides an electronic device including the above-mentioned bracket assembly.

10 Claims, 10 Drawing Sheets

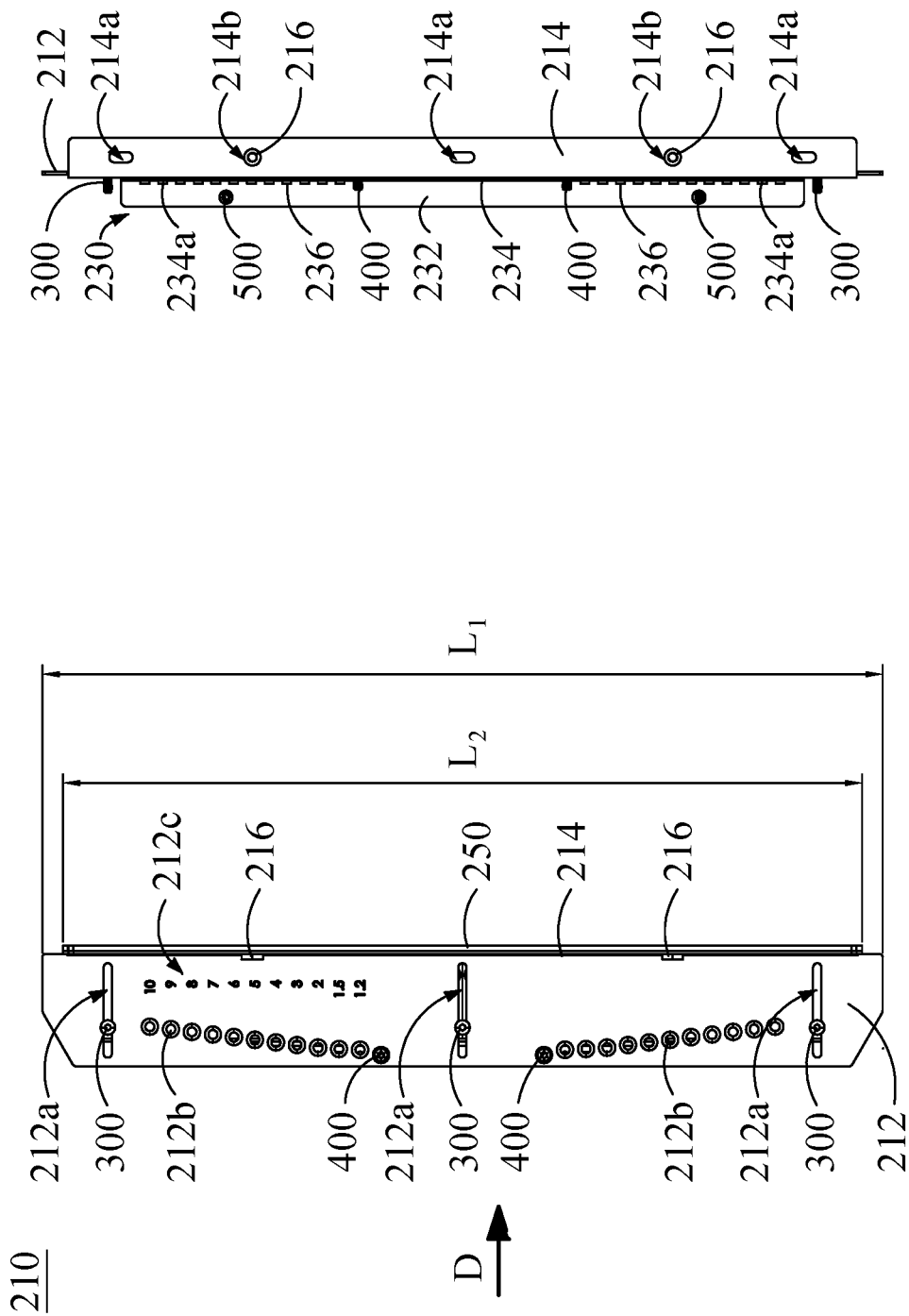

BRACKET ASSEMBLY AND ELECTRONIC DEVICE

CROSS-REFERENCE TO RELATED APPLICATION

This non-provisional application claims priority under 35 U.S.C. § 119(a) on Patent Application No(s). 111120012 filed in Taiwan, R.O.C. on May 30, 2022, the entire contents of which are hereby incorporated by reference.

BACKGROUND OF THE INVENTION

1. Field of the Invention

The present disclosure provides a bracket assembly and an electronic device, and in particular to a bracket assembly and an electronic device that can be suitable for different mounting methods and needs.

2. Description of the Related Art

Open frame electronic devices are one of the most common products in the industrial or commercial sector. Generally speaking, after purchasing electronic devices, such as computers and touch-type displays, some operators need to mount them in cabinets or machines in the corresponding industries, and then integrate and provide medium and large computer machines, such as ticket machines, ATMs, and industrial computers. In order to meet such needs, some hardware manufacturers will carry out preliminary packaging for computers, monitors and other electronic devices, and then attach the necessary parts of mounting electronic devices to integrate into open frame electronic devices, and provide them to downstream manufacturers for further use.

BRIEF SUMMARY OF THE INVENTION

According to the type of open frame electronic device mounted on the cabinet, it can be roughly divided into flat mount and standard mount. The so-called flat mount means that the front face of the electronic device is completely aligned with the outer surface of the decorative plate of the cabinet. For this reason, the electronic device is usually placed from the rear side to the front side of the cabinet during installation, and the electronic device is locked to the cabinet through locking pieces, such as rivets or screws, which is the rear mount; the so-called standard mount means that based on aesthetics or waterproof, dustproof and other purposes, the decorative plate of the cabinet will cover part of the electronic device, and only expose a visible area for the user to operate. In this case, the electronic device can also be pushed and locked directly to a predetermined position by a rear mount, or a decorative plate with a visible window can be pre-designed, and the electronic device is pushed from the front side to the rear side of the cabinet, and the electronic device is locked on the cabinet in the state of the bracket around or at the rear side of the electronic device abutting against the decorative plate, and finally the decorative plate is sealed, which is called the front mount.

However, at present, the open frame electronic devices and accessories provided by suppliers on the market only support a single mounting type and mounting method, so the user can only choose a specific supplier according to the corresponding mounting type or mounting method when purchasing, which has considerable restrictions on purchase and use. In addition, the bracket used in the installation of the above-mentioned electronic devices only has simple locking holes, so it cannot be carried out a customized adjustment in response to the different depths of the cabinet or the different thicknesses of the decorative plate of the user, and because the electronic device and the cabinet may not be even fully fixed, it results in a risk of relative displacement of the electronic device and the cabinet from the user pushing the electronic device during use.

On the other hand, if the position of the electronic device or bracket deviates during the mounting process, the user needs to completely unload the bracket, re-lock it after alignment, resulting in a protracted mounting process. Even more some of the brackets may not have locking holes, and the user need to purchase double-sided studs for locking or weld struts (commonly known as boss columns) by himself before mounting, further increasing the burden of installation.

The inventor exhausted his mind to research carefully, and then developed a bracket assembly and an electronic device that can be suitable for different mounting methods and needs, in order to achieve effects of shortening the mounting time, improving the use flexibility of electronic devices and reducing the mounting burden of users.

The disclosure provides a bracket assembly, comprising: a first bracket and a first lock bracket. The first bracket forms a plurality of first guide slots and a plurality of first locking holes, the first guide slot extends along a mounting direction, and a position of the first locking hole in the mounting direction is gradient; the first lock bracket is connected to the first bracket, and includes a first device connecting piece and a first bracket connecting piece, the first device connecting piece forms at least one first device locking hole thereon, the first bracket connecting piece is bent with respect to the first device connecting piece and forms a plurality of first lock holes.

In addition, the present disclosure further provides an electronic device, comprising an electronic device body and the above-mentioned bracket assembly, the electronic device body has a side face and a rear face, and the bracket assembly is configured on the electronic device body, wherein the first bracket is optionally locked to the side face by a plurality of first guide locking pieces and a first bracket locking piece, and the first guide locking piece is slid and provided in the first guide slot, and the first bracket locking piece is passed through and provided in one of these first locking holes and one of these first lock holes; the first lock bracket is optionally locked to the rear face by a first device locking piece, and the first device locking piece is passed through and provided in the first device locking hole.

Accordingly, the bracket assembly of the present disclosure can adjust the relative position of the first bracket and the electronic device through the first guide slot and the first locking hole, so it is suitable for different mounting types and mounting methods, thereby improving the flexibility of use. In addition, the electronic device of the present disclosure may adjust the relative position between the first bracket and the first lock bracket in the state of the first guide locking piece sliding and providing in the first guide slot, thus the bracket can be directly aligned and locked without completely unloading, greatly reducing the burden of installation.

To facilitate understanding of the above characteristics and effects of this present disclosure, embodiments together with the attached drawings for the detailed description of the present disclosure are provided.

BRIEF DESCRIPTION OF THE DRAWINGS

FIG. 2 is a schematic left side view of a first bracket and a first lock bracket in FIG. 1.

FIG. 3 is a schematic rear view of FIG. 2.

DETAILED DESCRIPTION OF THE INVENTION

Figure 1:
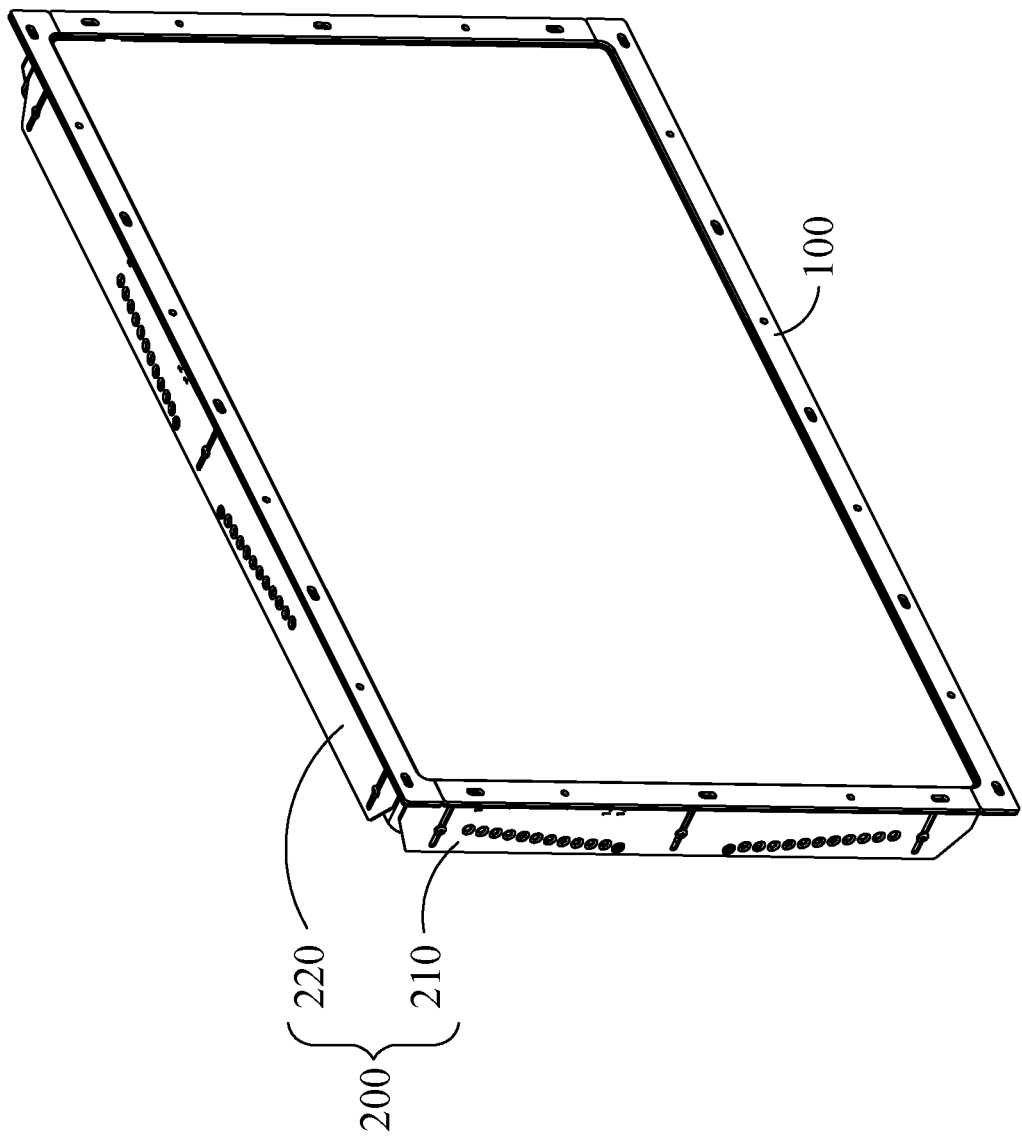
FIG. 1 is a schematic perspective view of an electronic device according to an embodiment of the present disclosure.

The aforementioned and other technical contents, characteristics and effects of the present disclosure can be clearly presented by the detailed description of preferable embodiments together with the attached drawings. It's worth mentioning that the direction terms mentioned in the following embodiments, such as: top, bottom, left, right, front or rear are only referred to the direction of the drawings. Therefore, the directional terms used are intended to illustrate, not to limit, the disclosure. In addition, in the following embodiments, the same or similar components will use the same or similar reference numerals.

Figure 4:
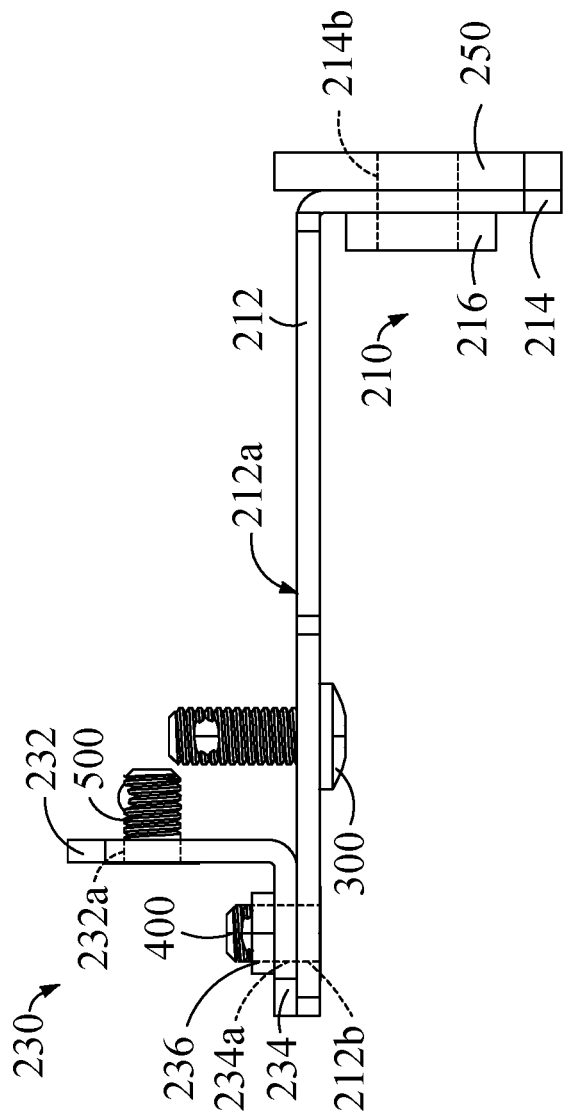
FIG. 4 is a schematic top view of FIG. 2.

Referring to FIGS. 1 to 4, FIG. 1 is a schematic perspective view of an electronic device according to an embodiment of the present disclosure, FIG. 2 is a schematic left side view of a first bracket and a first lock bracket in FIG. 1, FIG. 3 is a schematic rear view of FIG. 2, and FIG. 4 is a schematic top view of FIG. 2. The electronic device 1 of the present embodiment comprises an electronic device body 100 and a bracket assembly 200, the bracket assembly 200 is disposed on the electronic device body 100 and includes a first bracket 210 and a first lock bracket 230.

In detail, the electronic device body 1, for example, is an industrial computer or a touch display screen, and the bracket assembly 200 is disposed on a side of the electronic device body 100, for mounting the electronic device body 100 on a cabinet. In the present embodiment, the bracket assembly 200 comprises two first brackets 210 and two first lock brackets 230, respectively disposed on the left and right sides of the electronic device body 100. Further, the bracket assembly 200 further comprises a second bracket 220 and a second lock bracket 240 (may refer to FIG. 1 and FIG. 6), in the present embodiment, the number of the second bracket 220 and the second lock bracket 240 are also two, and are respectively configured on the upper and lower sides of the electronic device body 100, but the present disclosure is not limited to thereto, may be configured only a set of the first bracket 210 and the first lock bracket 230 and a set of the second bracket 220 and the second lock bracket 240 according to the needs of actual installation, even the electronic device body 100 may be simply mounted on the cabinet through the first bracket 210 and the first lock bracket 230 may be installed on the cabinet without configuring the second bracket 220 and the second lock bracket 240, as long as the effect of stable locking can be achieved.

As shown in FIGS. 2 to 4, the first bracket 210 includes a first body 212 and a first cabinet connecting piece 214, wherein the first body 212 forms a plurality of first guide slots 212a and a plurality of first locking holes 212b thereon, wherein the first guide slot 212a, for example, is an elliptical long slot, and the first locking hole 212b, for example, is an inclined hole, respectively suitable for accommodating a first guide locking piece 300 and a first bracket locking piece 400, and thus the first body 212 is fixed with respect to the electronic device body 100 and the first lock bracket 230, respectively; in addition, the first cabinet connecting piece 214 is bent with respect to the first body 212 and forms a plurality of first cabinet locking holes 214a, for locking the electronic device body 100 on the cabinet.

Specifically, the number of the first guide slot 212a in the present embodiment, for example, is three, extending along a mounting direction D and arranged on the first body 212 in equal intervals, and the first guide locking piece 300, for example, is a NYLOK screw, the number is also three, and is slid and provided in the corresponding first guide slot 212a. On the other hand, the first locking hole 212b may be configured on the first body 212 with a type of two symmetrical sets, the number of the first locking hole 212b of each set, for example, is 12, positions of these first locking holes 212b in the mounting direction D are gradient, and the first bracket locking piece 400 is likewise for example a NYLOK screw, the number, for example, is two and are respectively configured in one of the first locking holes 212b in two sets of the first locking hole 212b. Preferably, the first bracket 210 further forms a plurality of indication features 212c thereon, these indication features 212c, for example, are used to mark the distance numeral between each the first locking hole 212b and the mounting surface of the first cabinet connecting piece 214, and configured to be adjacent to these first locking hole 212b. By such a configuration, the user may choose to configure the first bracket locking piece 400 in the first locking hole 212b that has a specific distance from the mounting surface of the first cabinet connecting piece 214 according to different conditions such as cabinet depth or decorative plate thickness.

On the other hand, the first cabinet locking hole 214a, for example, is an elliptical hole, the number in the present embodiment, for example, is three and evenly configured on the first cabinet connecting piece 214. Accordingly, the user may use rivets and other locking pieces to pass through and provide in the first cabinet locking hole 214a, whereby the first cabinet connecting piece 214 together with the entire first bracket 210 are locked on the cabinet. Further, since some cabinets are suitable for locking with screws and other locking pieces, in order to make the first bracket 210 can have greater elasticity of use, preferably, the first cabinet connecting piece 214 further forms a plurality of first auxiliary locking holes 214b thereon, and these first auxiliary locking holes 214b form a threaded engagement feature therein, wherein the threaded engagement feature, for example, is a thread, it may assist the screw to tightly screw with the first cabinet connecting piece 214 in the process of locking into the cabinet. Preferably, the first bracket 210 further comprises a plurality of first threaded engagement parts 216, these first threaded engagement parts 216 are protruding with respect to the first cabinet connecting piece 214 and align their positions to the first auxiliary locking hole 214b, and the threaded engagement feature is simultaneously formed within the first auxiliary locking hole 214*b* and the first threaded engagement part 216, whereby the journey of the threaded engagement feature may be further extended and the threaded engagement area of the screw and the first cabinet connecting piece 214 may be increased.

Referring to FIGS. 3 and 4, the first lock bracket 230 of the present embodiment is connected to the first bracket 210, and includes a first device connecting piece 232 and a first bracket connecting piece 234, wherein the first device connecting piece 232 forms at least one first device locking hole 232*a* thereon, wherein the first device locking hole 232*a*, for example, is an inclined hole, the number in the present embodiment, for example, is two, and respectively suitable for providing a first device locking piece 500 to pass through and be configured, so that the first lock bracket 230 is locked on the electronic device body 100. On the other hand, the first bracket connecting piece 234 is bent with respect to the first device connecting piece 232 and forms a plurality of first lock holes 234*a*, the number and configuration spacing of these first lock holes 234*a* correspond to the first locking hole 212*b*, and the first lock hole 234*a* also forms the threaded engagement feature therein. By such a configuration, the user may use the first bracket locking piece 400 to pass through and provide in a specific first locking hole 212*b* and the corresponding first lock hole 234*a*, so that the first bracket 210 and the first lock bracket 230 are correspondingly fixed to each other. Preferably, the first lock bracket 230 also includes a plurality of first threaded engagement parts 236, these first threaded engagement parts 236 are protruding with respect to the first bracket connecting piece 234 and align their positions to the first lock hole 234*a*, whereby the journey of the threaded engagement feature may be further increased, so that the first bracket 210 and the first lock bracket 230 are firmly combined.

As shown in FIG. 4, the first bracket 210 and the first lock bracket 230 respectively form into an L shape. After the first bracket 210 and the first lock bracket 230 is correspondingly fixed to each other through the first bracket locking piece 400, the first bracket 210 may be locked to the left surface (or right surface) of the electronic device body 100 by the first guide locking piece 300 sliding and providing in the first guide slot 212*a*, and the first lock bracket 230 may be locked to the rear face of the electronic device body 100 by the first device locking piece 500 passing through and providing in the first device locking hole 232*a*. In other words, the first bracket 210 and the first lock bracket 230 may be locked on the electronic device body 100 in two independent directions, and then passed through and provided in the first cabinet locking hole 214*a* or the first auxiliary locking hole 214*b* through the rivets or screws and other locking pieces, the bracket assembly 200 together with the electronic device body 100 are locked on the cabinet. Preferably, the bracket assembly 200 further comprises a joint piece 250, wherein the joint piece 250, for example, is a rubber cushion, is configured on the first cabinet connecting piece 214, and the rigidity of the joint piece 250 is less than the rigidity of the first cabinet connecting piece 214. By such a configuration, when the first bracket 210 is attached to the rear side of the decorative plate of the cabinet, the joint piece 250 may be slightly deformed in response to the extrusion of the first bracket 210 and the decorative plate, in order to prevent unnecessary warping of the first bracket 210.

Figure 5:
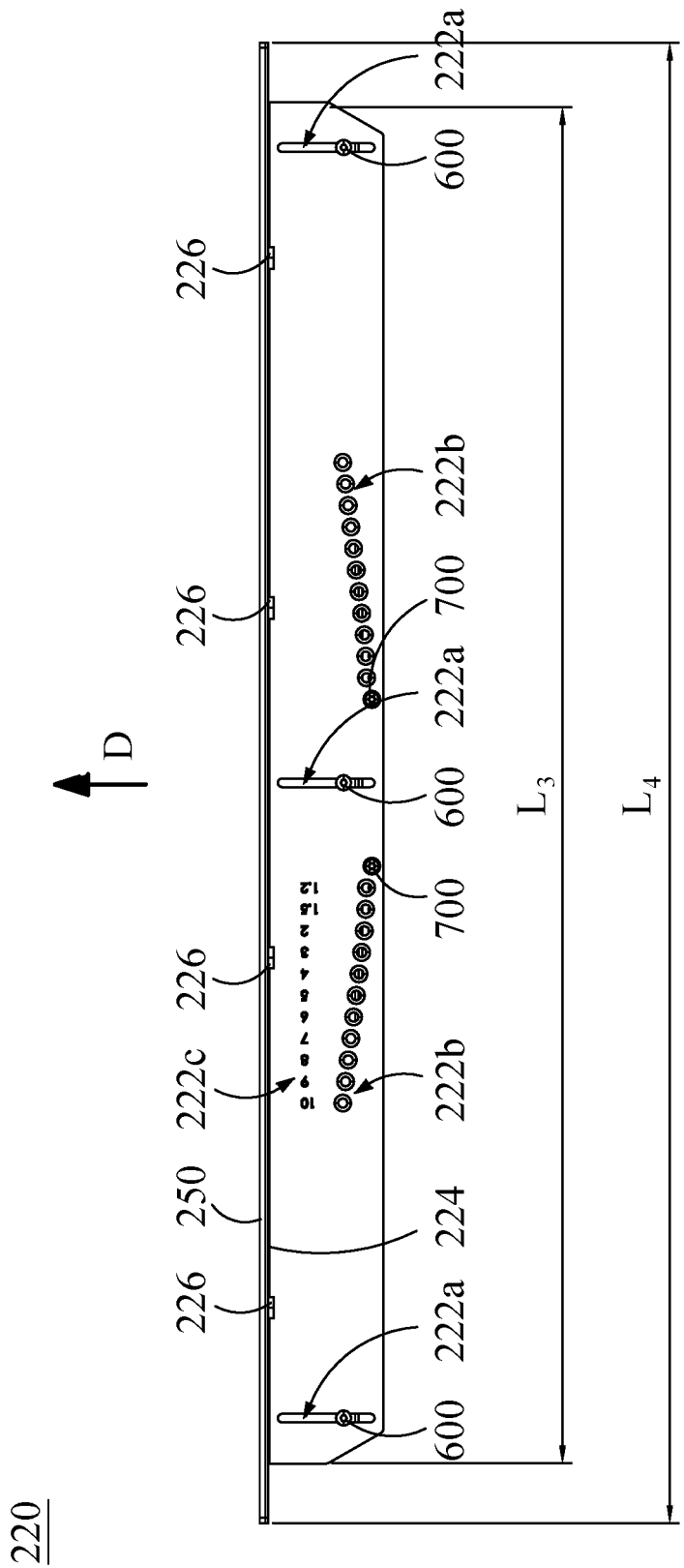
FIG. 5 is a schematic top view of the second bracket and the second lock bracket in FIG. 1.
Figure 6:
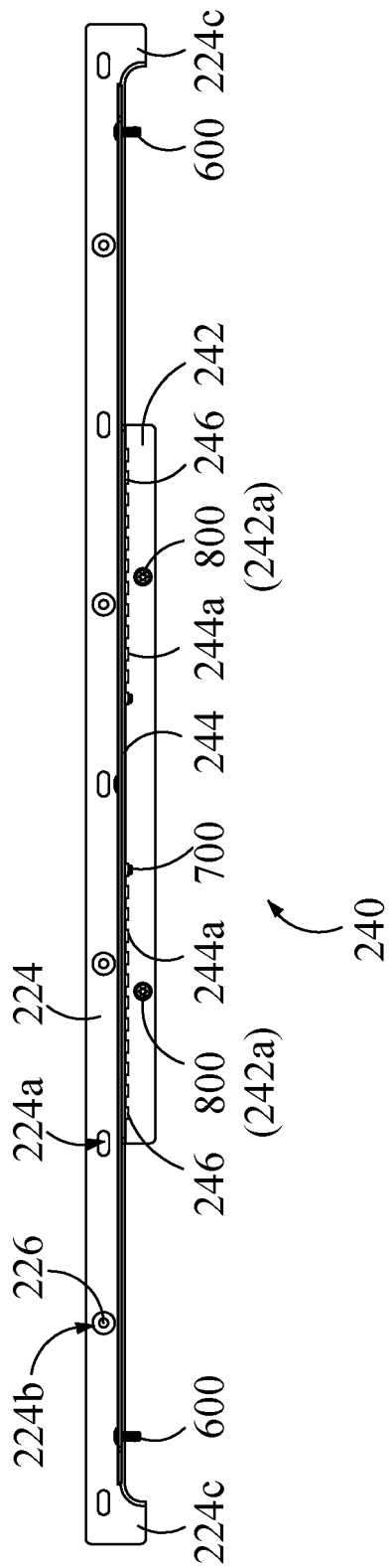
FIG. 6 is a schematic rear view of FIG. 5.
Figure 7:
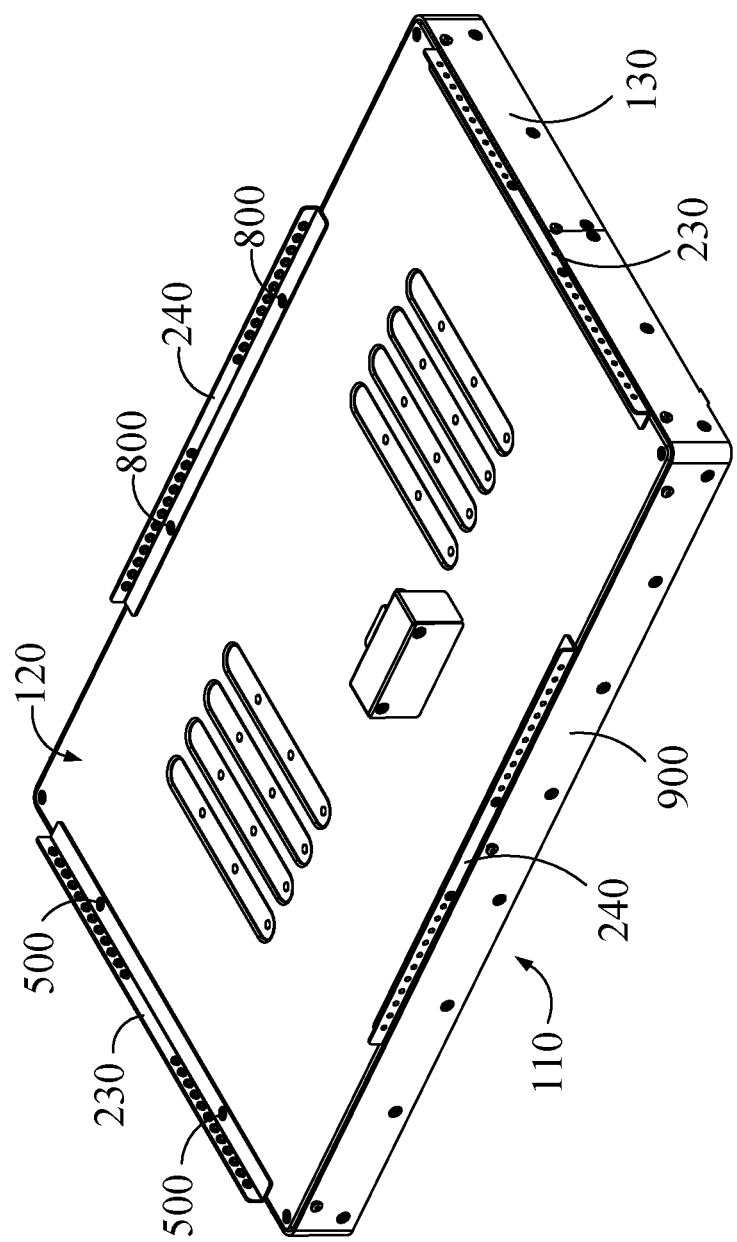
FIG. 7 is a schematic perspective view of a first mounting state of the electronic device of FIG. 1.

Referring to FIGS. 5 and 6, FIG. 5 is a schematic top view of the second bracket and the second lock bracket in FIG. 1, and FIG. 6 is a schematic rear view of FIG. 5. The second bracket 220 of the present embodiment is similar to the first bracket 210, comprising a second body 222 and a second cabinet connecting piece 224, wherein the second body 222 forms a plurality of second guide slots 222*a* and a plurality of second locking holes 222*b* thereon, respectively suitable for accommodating a second guide locking piece 600 and a second bracket locking piece 700, so that the second body 222 is fixed with respect to the electronic device body 100 and the second lock bracket 240, respectively, wherein the number of the second guide slot 222*a*, for example, is three, extending along a mounting direction D and arranged on the second body 222 in equal intervals, and the second locking holes 222*b* may be also configured on the first body 212 with a symmetrical type, positions of these second locking holes 222*b* in the mounting direction D are gradient. Preferably, the second bracket 220 further forms a plurality of indication features 222*c* thereon, these indication features 222*c*, for example, are used to mark the distance between each the second locking hole 222*b* and the mounting surface of the second cabinet connecting piece 214, and configured to be adjacent to these second locking hole 222*b*. By such a configuration, the user may choose to configure the second bracket locking piece 700 in the second locking hole 222*b* that has a specific distance from the mounting surface of the second cabinet connecting piece 224 according to different conditions such as cabinet depth or decorative plate thickness.

On the other hand, the second cabinet connecting piece 214 is bent with respect to the second body 222 and forms a plurality of second cabinet locking holes 224*a*, these second cabinet locking hole 214*a*, for example, are elliptical holes, the number, for example, is five and evenly configured on the second cabinet connecting piece 224. Accordingly, the user may use rivets and other locking pieces to pass through and provide in the second cabinet locking hole 224*a*, whereby the second cabinet connecting piece 224 together with the entire second bracket 220 are locked on the cabinet. Similarly, the second cabinet connecting piece 224 preferably further forms a plurality of second auxiliary locking holes 224*b*, and these second auxiliary locking holes 224*b* form a threaded engagement feature therein, when the user desires to lock by using a screw, it may assist the screw to tightly screw with the second cabinet connecting piece 224. More preferably, the second bracket 220 further comprises a plurality of second threaded engagement parts 226, these second threaded engagement parts 226 are protruding with respect to the second cabinet connecting piece 224 and align their positions to the second auxiliary locking hole 224*b*, and the threaded engagement feature simultaneously is formed within the second auxiliary locking hole 224*b* and the second threaded engagement part 226, whereby the journey of the threaded engagement feature may be further extended and the threaded engagement area of the screw and the second cabinet connecting piece 224 may be increased.

As shown in FIGS. 2 and 5, the length $L_2$ of the first cabinet connecting piece 214 in the present embodiment is less than the length $L_1$ of the first body 212, and the length $L_4$ of the second cabinet connecting piece 224 is greater than the length $L_3$ of the second body 222. By such a configuration, the first bracket 210 and the second bracket 220 can be simultaneously mounted on the electronic device body 100, the relative position of they and the electronic device body 100 can be synchronously adjusted, the specific details will be described in detail as below. Similarly, the joint piece 250 may also be configured on the second cabinet connecting piece 224, and the rigidity of the joint piece 250 is less than the rigidity of the second cabinet connecting piece 224, thereby preventing unnecessary warping at the second bracket 220 attaching to the rear side of the decorative plate of the cabinet.

In addition, the second lock bracket 240 is connected to the second bracket 220, and includes a second device connecting piece 242 and a second bracket connecting piece 244, similar to the first lock bracket 230, the second device connecting piece 242 is also formed at least one second device locking hole 242a thereon, in order to lock the second lock bracket 240 on the electronic device body 100; the second bracket connecting piece 244 is bent with respect to the second device connecting piece 242 and forms a plurality of second lock holes 244a, the number and configuration spacing of these second lock holes 244a correspond to the second locking hole 222b, and the second lock hole 244a also forms the threaded engagement feature therein. By such a configuration, the user may use the second bracket locking piece 700 to pass through and provide in a specific second locking hole 222b and the corresponding second lock hole 244a, so that the second bracket 220 and the second lock bracket 240 are correspondingly fixed to each other. Preferably, the second lock bracket 240 also includes a plurality of second threaded engagement parts 246, these second threaded engagement parts 246 are protruding with respect to the second bracket connecting piece 244 and align their positions to the second lock hole 244a, whereby the journey of the threaded engagement feature may be further increased, so that the second bracket 220 and the second lock bracket 240 are firmly combined.

It is worth mentioning that since the first lock bracket 230 and the second lock bracket 240 respectively act as the intermediary locking medium between the first bracket 210 and the second bracket 220 and the electronic device body 100, the number and spacing of the first locking hole 212b and the second locking hole 222b can also be adjusted to the same in design, so that the first lock bracket 230 and the second lock bracket 240 may be designed as exactly the same components, making it more convenient to manufacture the lock bracket, however, the present disclosure is not limited to this form.

Figure 8:
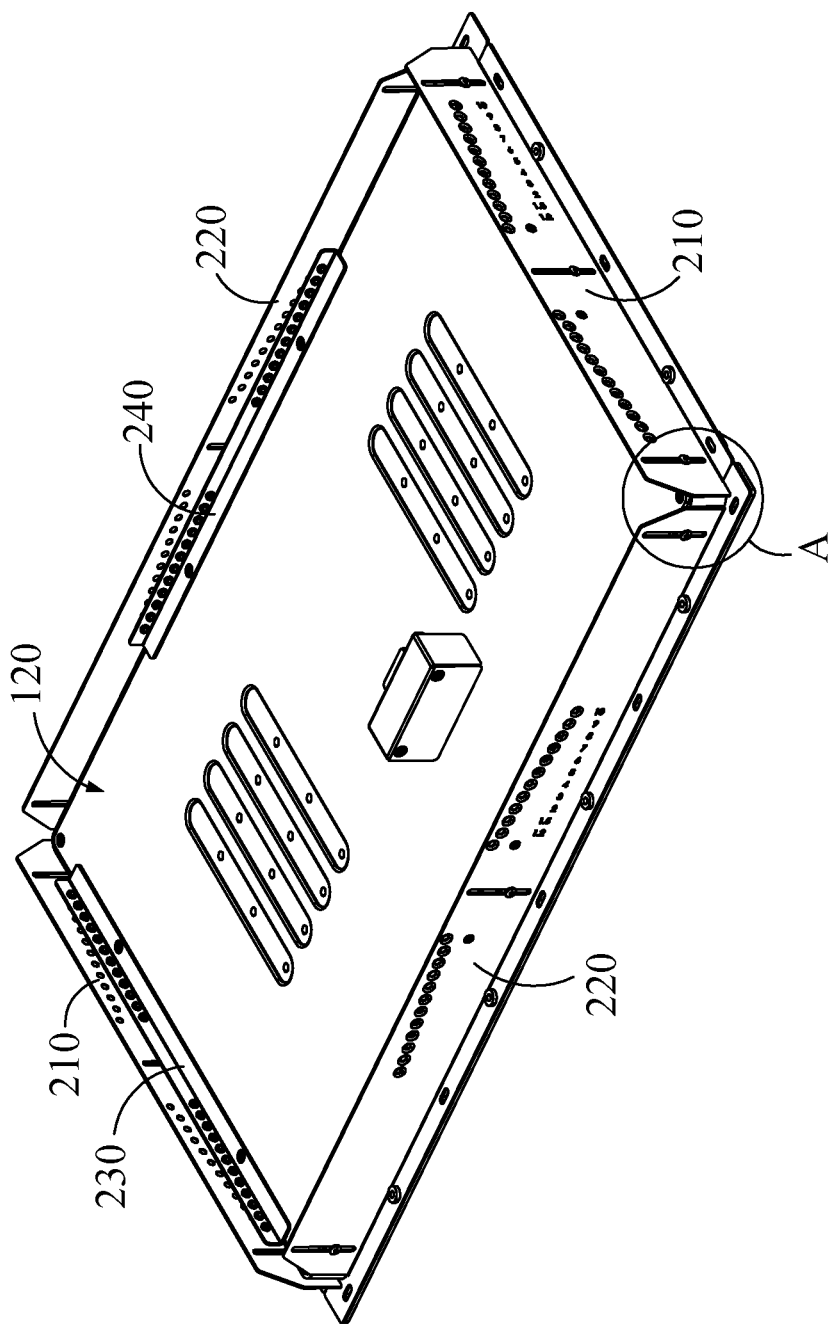
FIG. 8 is a schematic perspective view of a second mounting state of the electronic device of FIG. 1.
Figure 9:
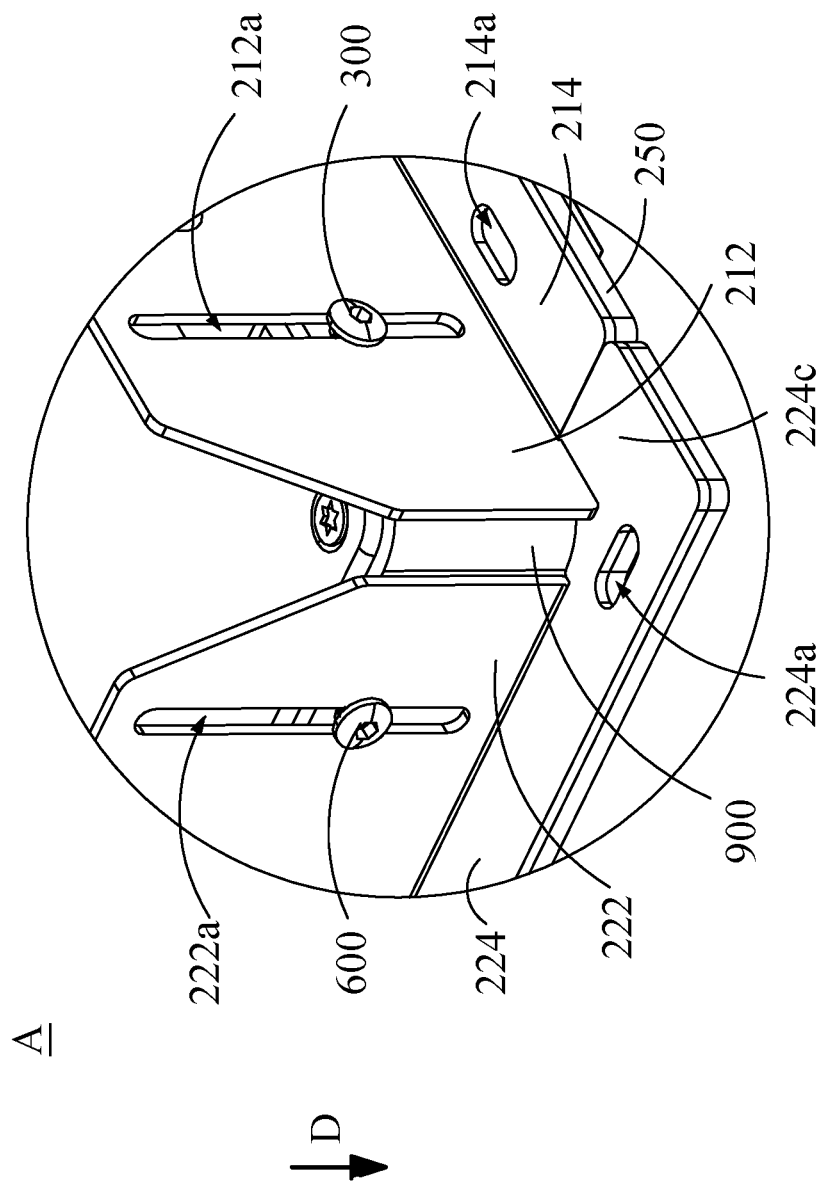
FIG. 9 is an enlarged schematic view of area A in FIG. 8.
Figure 10:
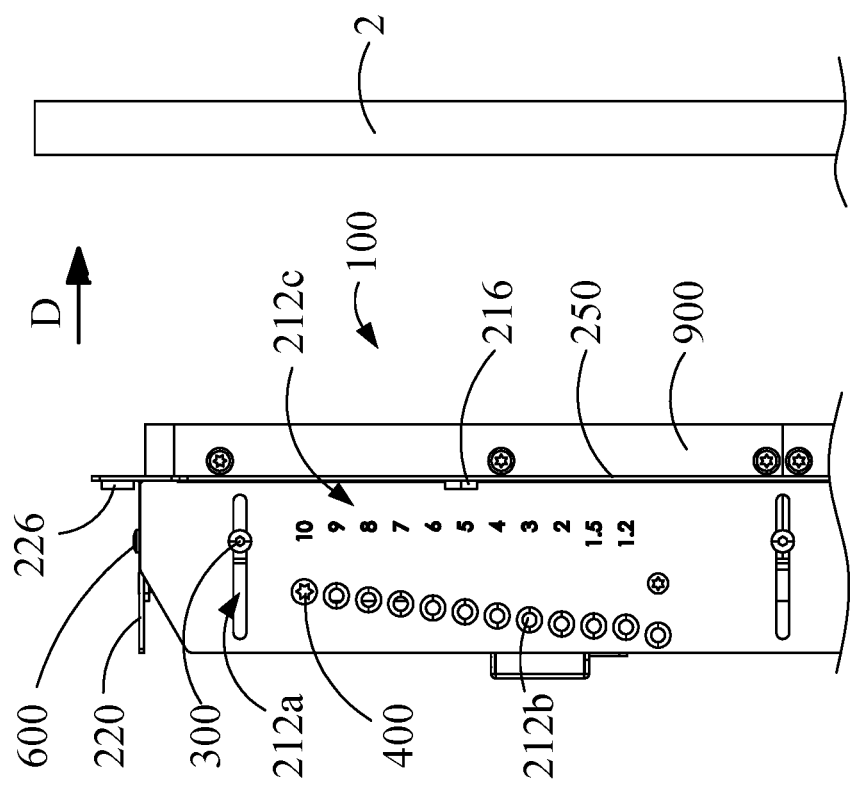
FIG. 10 is a schematic view showing that when the electronic device of FIG. 1 is mounted in a first mounting method.
Figure 11:
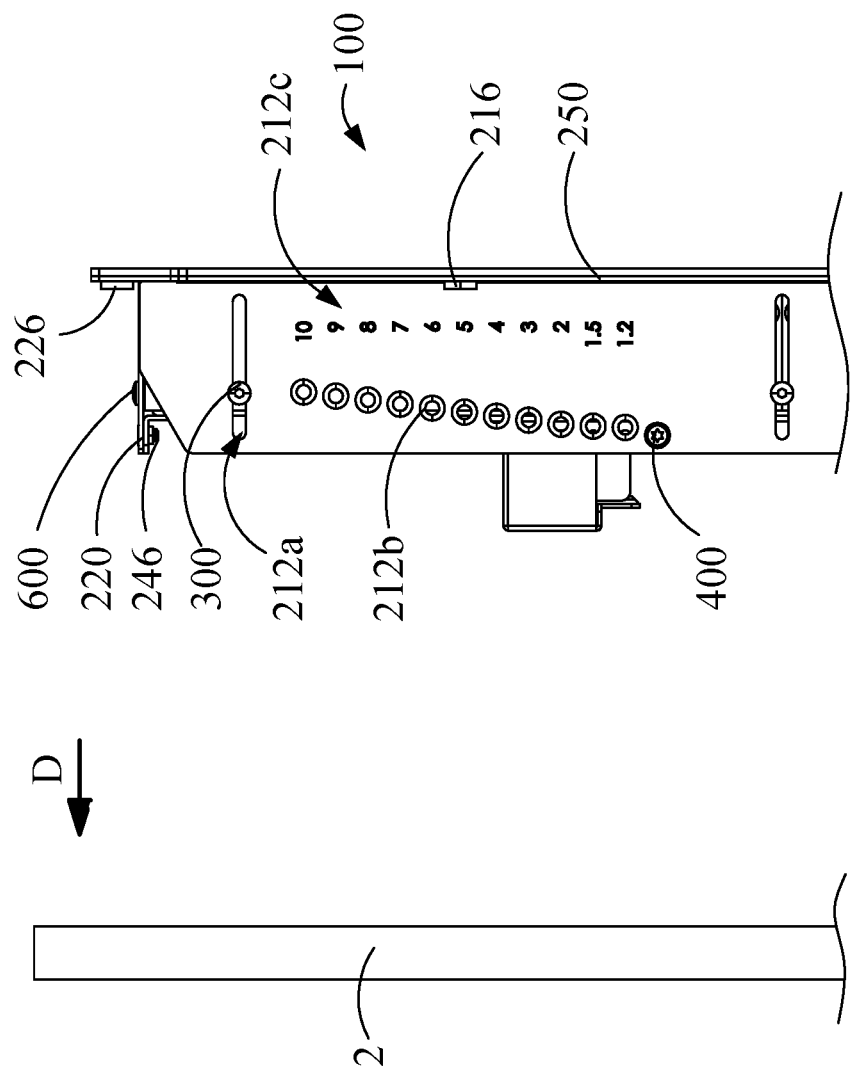
FIG. 11 is a schematic view showing that when the electronic device of FIG. 1 is mounted in a second mounting method.

The following will be a detailed introduction to how the electronic device 1 of the present embodiment is mounted to the cabinet, referring to FIGS. 7 to FIG. 11, FIG. 7 is a schematic perspective view of a first mounting state of the electronic device of FIG. 1, FIG. 8 is a schematic perspective view of a second mounting state of the electronic device of FIG. 1, FIG. 9 is an enlarged schematic view of area A in FIG. 8, FIG. 10 is a schematic view showing that when the electronic device of FIG. 1 is mounted in a first mounting method, and FIG. 11 is a schematic view showing that when the electronic device of FIG. 1 is mounted in a second mounting method. As shown in drawings, the electronic device body 100 of the present embodiment has a front face 110, a rear face 120 and a side face 130, wherein the front face 110 and the rear face 120 are opposite each other, and the side face 130 is configured between the front face 110 and the rear face 120. Preferably, the electronic device 1 further comprises a sealing piece 900, wherein the sealing piece 900, for example, is a sealing strip that can achieve waterproof and dustproof, and may be attached on the side face 130 in a form of a single layer or multi-layer, may also cover part of the front side 110 and the rear face 120 according to actual needs, the present disclosure does not limit to this.

When it is necessary to mount the electronic device 1 to the cabinet 2, the user may respectively lock the first lock bracket 230 and the second lock bracket 240 on the corresponding hole positions of the rear face 120 of the electronic device body 100 through the first device locking piece 500 and the second the second device locking piece 800. Thereafter, as shown in FIG. 8, the first bracket 210 and the second bracket 220 are temporarily attached on the side face 130 of the electronic device body 100, and the first guide locking piece 300 and the second guide locking piece 600 are respectively passed through and provided on the first guide slot 212a, the second guide slot 222a and the corresponding hole positions of the side face 130 of the electronic device body 100. Since the first guide locking piece 300 and the second guide locking piece 600 and the electronic device body 100 have been correspondingly fixed to each other, the first guide locking piece 300 and the second guide locking piece 600 may guide the first bracket 210 and the second bracket 220 to slide along the mounting direction D without the offset of other directions through the limit relationship between the first guide slot 212a and the second guide slot 222a in the subsequent mounting process. At this time, the sealing piece 900, for example, is configured between the electronic device body 100 and the first bracket 210, thereby achieving a preferable sealing effect.

Then, the user may refer to the indication features 212c and/or the indication features 222c to adjust the relative position of the first bracket 210 and the second bracket 220 and the electronic device body 100 in the mounting direction D according to the conditions of mounting type, the mounting method, the depth of the cabinet 2 or the decorative plate thickness of the cabinet 2, for example, the relative distance of the first cabinet connecting piece 214 and the front face 110 in the mounting direction D can be determined by coinciding the holes of both the first locking hole 212b and the first lock hole 234a. Preferably, as shown in FIGS. 6 and 9, the second cabinet connecting piece 224 includes two wing parts 224c, these wing parts 224c are configured on two sides of the second cabinet connecting piece 224. When the first bracket 210 and the second bracket 220 are configured on the side face 130 of the electronic device body 100, the wing part 224c is abutted on the first cabinet connecting piece 214, and an orthogonal projection of a part of the first body 212 (i.e., part of the length that is greater than the first cabinet connecting piece 214) in the mounting direction D is located on the wing part 224c. By such a configuration, when the positions of the first bracket 210 and the second bracket 220 are adjusted, it is not necessary to unload them from the electronic device body 100, but they can be slid to carry out fine adjustment through the limit of the first guide slot 212a/the second guide slot 222a and the first guide locking piece 300/the second guide locking piece 600, thereby greatly simplifying the adjustment process. In addition, when the positions of the first bracket 210/the second bracket 220 are adjusted, because the protruding portion of the first body 212 with respect to the first cabinet connecting piece 214 and the wing part 224c abut against each other, the adjacent second bracket 220/first bracket 210 will be simultaneously driven and moved without individually adjusting the bracket at each side.

When the first bracket 210 and the second bracket 220 at each side are adjusted to the correct position, the user may use the first bracket locking piece 400 to pass through and provide in the first locking hole 212b and the first lock hole 234a (and the first threaded engagement part 236), and use the second bracket locking piece 700 to pass through and provide in the second locking hole 222b and the second lock hole 244a (and the second threaded engagement part 246), thereby ensuring that the position between the first bracket 210 and the first lock bracket 230 and the position between the second bracket 220 and the second lock bracket 240 will not move correspondingly. At this time, the first guide locking piece 300 and the second guide locking piece 600 may be further locked tightly, in order to ensure that the first bracket 210 and the second bracket 220 are more firmly locked on the electronic device body 100. Finally, the electronic device body 100 and the bracket assembly 200 that the relative position is established are mounted together on the cabinet 2, the installation of the electronic device 1 can be completed.

As shown in FIG. 10, when the decorative plate of the cabinet 2 has a certain thickness and has formed a visible window, the user may adjust the bracket assembly 200 according to the indication feature 212c to make the first bracket 210 and the second bracket 220 and the front face 110 of the electronic device body 100 have a thickness difference. When the joint piece 250 is attached to the rear side of the decorative plate of the cabinet 2, the front face 110 of the electronic device body 100 is also aligned with the surface of the decorative plate of the cabinet 2 or slightly lower than the surface of the decorative plate, so as to achieve the effect of flat mount or standard mount; on the other hand, as shown in FIG. 11, if the cabinet 2 belongs to the design that the electronic device 1 needs to be mounted first and then covered with the decorative plate, the user may also adjust the bracket assembly 200 according to the indication feature 212c to make the first bracket 210 and the second bracket 220 align with the front face 110 of the electronic device 100 or slightly higher than the front face 110 and is pre-mounted, accordingly, in the subsequent coverage operation, the decorative plate will be attached on the first cabinet connecting piece 214/the second cabinet connecting piece 224 or the joint piece 250 without directly pressuring to the front face 110, thereby avoiding damage to the electronic device body 100. Further, since the first cabinet connecting piece 214/the second cabinet connecting piece 224 forms the different types of locking holes (the first cabinet locking hole 214a, the first auxiliary locking hole 214b) thereon, the user can choose a suitable locking piece for locking without additionally mounting or welding studs or boss columns.

In summary, the electronic device 1 of the present embodiment may freely adjust the relative position of the first bracket 210 and/or the second bracket 220 and the electronic device body 100 by the bracket assembly 200 to meet different mounting types, mounting methods, depths of the cabinet 2 and decorative plate thicknesses of the cabinet 2 and other conditions, thereby greatly improving the flexibility of use and scope of application. In addition, since the first bracket 210 is optionally locked to the side face 130 of the electronic device body 100 by the first guide locking piece 300 and the first bracket locking piece 400, and the first lock bracket 230 is optionally locked to the rear face 120 of the electronic device body 100 by the first device locking piece 500, there is no need to unload and readjust each bracket, and the bracket can be combined with the electronic device body 100 by different directions, thereby effectively improving the stability of the structure in the mounting process.

While the present disclosure has been described by means of preferable embodiments, those skilled in the art should understand the above description is merely embodiments of the disclosure, and it should not be considered to limit the scope of the disclosure. It should be noted that all changes and substitutions which come within the meaning and range of equivalency of the embodiments are intended to be embraced in the scope of the disclosure. Therefore, the scope of the disclosure is defined by the claims.

What is claimed is:

1. An electronic device, comprising: an electronic device body having a side face and a rear face; and a bracket assembly, comprising: a first bracket, forming a plurality of first guide slots and a plurality of first locking holes, the plurality of first guide slots extend along a mounting direction, and positions of the plurality of first locking holes in the mounting direction are gradient; and a first lock bracket, connected to the first bracket, and including: a first device connecting piece, the first device connecting piece forms at least one first device locking hole thereon; and a first bracket connecting piece, bent with respect to the first device connecting piece and forming a plurality of first lock holes; and the first bracket is optionally locked to the side face by a plurality of first guide locking pieces and a first bracket locking piece, and the first guide locking piece is slid and provided in the first guide slot, and the first bracket locking piece is passed through and provided in one of the plurality of first locking holes and one of the plurality of first lock holes.

2. The bracket assembly according to claim 1, wherein the first bracket includes a first body and a first cabinet connecting piece, the plurality of first guide slots and the plurality of first locking holes are configured on the first body, the first cabinet connecting piece is bent with respect to the first body and forms a plurality of first cabinet locking holes.

3. The bracket assembly according to claim 2, wherein the first cabinet connecting piece further forms a plurality of first auxiliary locking holes thereon, and the plurality of first lock holes and the plurality of first auxiliary locking holes respectively form a threaded engagement feature therein.

4. The bracket assembly according to claim 3, wherein the first bracket and the first lock bracket respectively further comprise a plurality of first threaded engagement parts, the plurality of first threaded engagement parts are respectively protruding with respect to the first bracket connecting piece and the first cabinet connecting piece and align their positions to the plurality of first lock holes and the plurality of first auxiliary locking holes, and each the threaded engagement feature is simultaneously formed within the plurality of first lock holes, the plurality of first auxiliary locking holes and the plurality of first threaded engagement parts.

5. The bracket assembly according to claim 2, further comprising:
a second bracket, configured to be adjacent to the first bracket and including a second body and a second cabinet connecting piece, the second body forms a plurality of second guide slots and a plurality of second locking holes thereon, the plurality of second guide slots extend along the mounting direction, positions of the plurality of second locking holes in the mounting direction are gradient, the second cabinet connecting piece is bent with respect to the second body and forms a plurality of second cabinet locking holes;
wherein a length of the first cabinet connecting piece is less than a length of the first body, and a length of the second cabinet connecting piece is greater than a length of the second body.

6. The bracket assembly according to claim 5, wherein the second cabinet connecting piece includes two wing parts, the two wing parts are configured on two sides of the second cabinet connecting piece and abutted on the first cabinet connecting piece, and an orthogonal projection of a part of the first body in the mounting direction is located on the two wing parts.

7. The bracket assembly according to claim 2, further comprising a joint piece, the joint piece is configured on the first cabinet connecting piece, and the rigidity of the joint piece is less than the rigidity of the first cabinet connecting piece.

8. The bracket assembly according to claim 1, wherein the first bracket further forms a plurality of indication features thereon, and the plurality of indication features are configured to be adjacent to the plurality of first locking holes.

9. The bracket assembly according to claim 1, wherein the first lock bracket is optionally locked to the rear face by a first device locking piece, and the first device locking piece is passed through and provided in the at least one first device locking hole.

10. The electronic device according to claim 9, further comprising a sealing piece, and the sealing piece is configured between the electronic device body and the first bracket.

\* \* \* \* \*